(12) United States Patent
Fukuda et al.

(10) Patent No.: US 7,595,540 B2
(45) Date of Patent: Sep. 29, 2009

(54) SEMICONDUCTOR DEVICE AND METHOD OF MANUFACTURING THE SAME

(75) Inventors: Toshiyuki Fukuda, Kadoma (JP); Eizou Fujii, Kadoma (JP); Yutaka Fukai, Kadoma (JP); Yutaka Harada, Kadoma (JP); Kiyokazu Itoi, Kadoma (JP)

(73) Assignee: Panasonic Corporation, Osaka (JP)

( * ) Notice: Subject to any disclaimer, the term of this patent is extended or adjusted under 35 U.S.C. 154(b) by 496 days.

(21) Appl. No.: 11/488,062

(22) Filed: Jul. 18, 2006

(65) Prior Publication Data

US 2007/0018301 A1 Jan. 25, 2007

(30) Foreign Application Priority Data

Jul. 19, 2005 (JP) .............................. 2005-207917
Apr. 13, 2006 (JP) .............................. 2006-110350

(51) Int. Cl.
*H01L 27/14* (2006.01)
*H01L 31/00* (2006.01)

(52) U.S. Cl. ....................... 257/431; 257/432; 257/433; 257/435; 257/699; 257/720; 257/704; 257/710; 257/713; 438/48; 438/54; 438/64; 438/69

(58) Field of Classification Search .................. 257/431, 257/432, 433, 434, 435, 699, 720, 704, 710, 257/713; 438/48, 54, 64, 69
See application file for complete search history.

(56) References Cited

U.S. PATENT DOCUMENTS 7,005,720 B2* 2/2006 Huang et al. ................. 257/433
2006/0202314 A1* 9/2006 Yee et al. ..................... 257/678

FOREIGN PATENT DOCUMENTS

JP 2002164524 A 6/2002

* cited by examiner

*Primary Examiner*—Kenneth A Parker
*Assistant Examiner*—Joseph Nguyen
(74) *Attorney, Agent, or Firm*—Steptoe & Johnson LLP

(57) ABSTRACT

A semiconductor device including a package (2) having a plurality of wall portions (9a) and a plurality of conductor portions (4), a semiconductor element such as a solid-state image pickup device (1) mounted in an internal space of the base, thin metal wires (5) electrically connecting the semiconductor element and the conductor portions (4) between the wall portions (9a), a resin sealing material (7) implanted in the spaces between the wall portions (9a), and a closing member such as a cover glass (6). The region for connecting the thin metal wires (5) and the wall portion (9a) region overlap each other, so that the device can be reduced in size and in height. The cover glass (6) can not move easily from the correct position because the wall portions (9a) serve as supporting columns, thereby improving the yield.

23 Claims, 13 Drawing Sheets

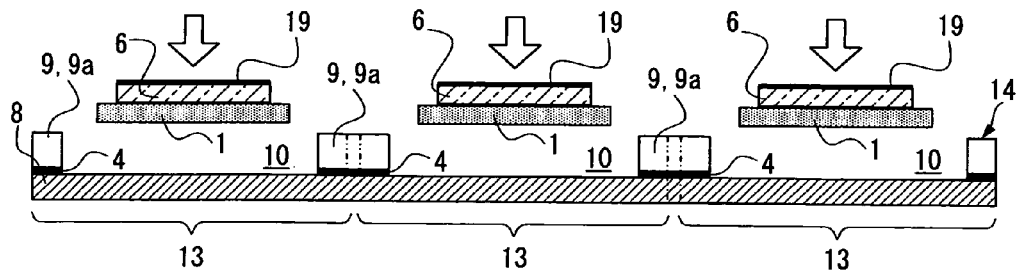
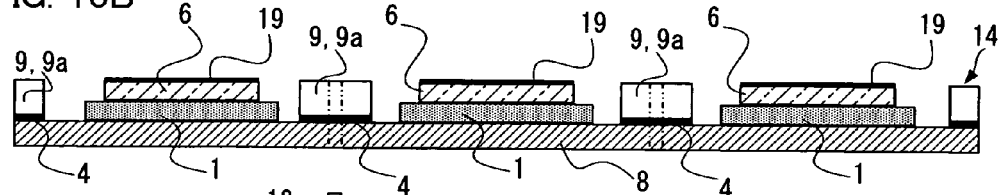
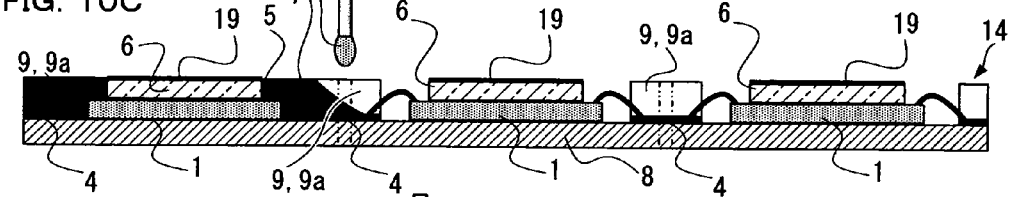
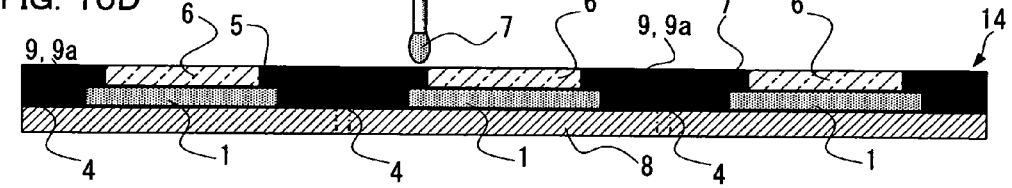
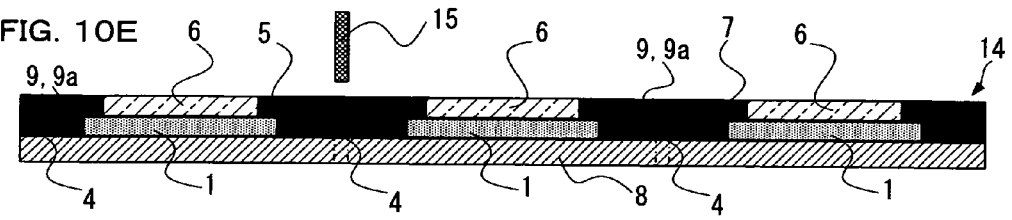
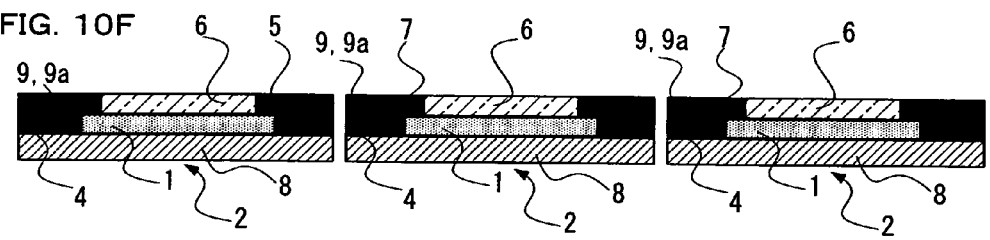

SEMICONDUCTOR DEVICE AND METHOD OF MANUFACTURING THE SAME

FIELD OF THE INVENTION

The present invention relates to a semiconductor device having a semiconductor element mounted in a package having conductor portions and a method of manufacturing the same.

BACKGROUND OF THE INVENTION

There have been provided semiconductor devices having a semiconductor element mounted in a bare chip state in a package having conductor portions. For example, a solid-state image pickup device is known in which, as shown in FIG. 14, a solid-state image pickup element 21 is mounted in a package 22 in a recessed form; a plurality of electrode pads formed on a major surface of the solid-state image pickup element 21 and inner terminal portions in a plurality of conductor portions 24 formed in the package 22 are respectively connected to each other by thin metal wires 25; and a cover glass 26 is bonded to an upper surface of the package 22 to close the interior of the package in an airtight manner. In this type of solid-state image pickup device, the inner terminal portions in the conductor portions are disposed in the cavity of the package and the thin metal wires from the solid-state image pickup element are connected to the inner terminal portions. It is necessary to provide a region for this connection in the cavity. Therefore it is difficult to reduce the size in the longitudinal or widthwise direction or the height of the device.

Another solid-state image pickup device (Japanese Patent Laid-Open No. 2002-164524) is known which is designed to be reduced in size, as described below. As shown in FIG. 15, electrode pads 22a are disposed on upper surfaces of side wall portions of a package 22; electrode pads of a solid-state image pickup element 21 mounted in the package 22 are connected to the electrode pads 22a by thin metal wires 25; a resin layer 27 is provided on the upper surfaces of the side wall portions of the package 22 along the entire periphery of the same so as to cover connecting portions of the electrode pads 22a and the thin metal wires 25; and a cover glass 26 is bonded on the resin layer 27. This solid-state image pickup device can be reduced in size in the longitudinal and widthwise directions in comparison with conventional ones but cannot be reduced in height. Also, the amount of application of the resin for covering the connecting portions of the electrode pads and the thin metal wires on the upper surfaces of the package side wall portions cannot be made uniform. Therefore, the cover glass placed on the applied resin can move easily before the resin is set to have a deviation from the correct position in the X-, Y- or θ-direction.

An optical device in which a cover glass is attached to an upper surface of an optical element such as a solid-state image pickup element instead of being disposed in a space above the optical element is also known (Japanese Patent Laid-Open No. 2003-197885). However, a connection region in a cavity is also required when this optical device is mounted in a package and wire-bonded, as in the case of the above-described conventional solid-state image pickup device.

DISCLOSURE OF THE INVENTION

In view of the above-described problem, an object of the present invention is to provide a semiconductor device which is smaller in size, and in which misalignment of a cover glass or the like when the semiconductor device is formed as an optical device such as a solid-state image pickup device is prevented to improve the yield.

To achieve the above-described object, according to the present invention, there is provided a semiconductor device including a package having a base formed of a base plate portion and a plurality of wall portions standing upright on a peripheral end of the base plate portion, and a plurality of conductor portions each exposed in a space between two of the wall portions adjacent to each other in a direction along the periphery of the base plate portion, a semiconductor element mounted in an internal space of the base, thin metal wires electrically connecting electrodes of the semiconductor element and the conductor portions between the wall portions, resin portions implanted in the spaces between the wall portions so as to cover connecting portions of the conductor portions and the thin metal wires, and a closing member for closing the internal space of the base in which the semiconductor element is mounted.

The wall portions are disposed at least at corners of the base plate portion. Also, the wall portions are arranged so as to form the shape of a frame along sides of the base plate portion. One or a plurality of conductor portions may be disposed in each of the spaces between the wall portions.

The closing member may be a lid plate fixed on upper surfaces of the wall portions and the resin portions between the wall portions with the same resin as of the resin portions or with a different resin from the resin portions. When the semiconductor element is an optical element, a transparent lid plate is used as the lid plate.

The closing member may be a resin filled in the internal space of the base so as to also cover an upper surface portion of the semiconductor element.

When the semiconductor element is an optical element, the closing member may comprise a transparent lid plate positioned above the semiconductor element and a resin filled in the internal space of the base around the lid plate.

It is advantageous to form a step portion for positioning the lid plate in each wall portion. Preferably, outer surfaces of the wall portions and outer surfaces of the resin portions are flush with each other.

According to the present invention, there is provided a method of manufacturing a semiconductor device, including forming a package having a base formed of a base plate portion and a plurality of wall portions standing upright on a peripheral end of the base plate portion, and a plurality of conductor portions each exposed in a space between two of the wall portions adjacent to each other in a peripheral direction of the periphery of the base plate portion, mounting a semiconductor element in an internal space of the base, electrically connecting electrodes of the semiconductor element and the conductor portions between the wall portions by means of thin metal wires, filling the spaces between the wall portions with a resin so as to cover connecting portions between the conductor portions and the thin metal wires, and closing the internal space of the base with a sealing member.

When the package is formed, the base plate portion and the plurality of wall portions are formed integrally with each other, and arrayed in a plurality of sets so that at least the base plate portions and the wall portions of the bases adjacent to each other are formed continuously with each other. After the internal space of the base has been closed with the closing member, dicing is performed in a direction to bisect the wall portions continuously formed between the adjacent bases, so that the continuous packages are divided into individual semiconductor devices each including the semiconductor element.

When the internal space of the base is closed, a lid plate for covering an upper end opening of the base may be used as the closing member, and may be fixed on upper surfaces of the wall portions and resin portions between the wall portions by the same resin as of the resin portions or with a different resin from the resin portions. When the semiconductor element is an optical element, a transparent lid plate is used as the lid plate. It is advantageous that the resin for fixing the lid plate is placed on the upper surfaces of the wall portions simultaneously when the spaces between the wall portions are filled with the same resin or a different resin therefrom.

When the internal space of the base is closed, the resin may be used as the closing member to fill the internal space of the base so as to also cover an upper surface portion of the semiconductor element.

When the semiconductor element is an optical element, the method may further include, in closing the internal space of the base with a sealing member, placing on the upper surface portion of the semiconductor element a transparent lid plate covered with a cover sheet, filling the internal space of the base up to the position of the upper surface of the transparent lid plate with the resin for filling the spaces between the wall portions, and removing the cover sheet after the resin has been set.

An injection molding method may be employed for filling the resin. Alternatively, an application method may be employed for filling the resin, and potting of the resin around the transparent lid plate may be performed after removal of the cover sheet.

It is advantageous that filling the internal space of the base with the resin is performed simultaneously when the spaces between the wall portions are filled with the resin.

BRIEF DESCRIPTION OF THE DRAWINGS

FIGS. 10A to 10F are diagrams for explaining a first method of manufacturing the solid-state image pickup device shown in FIGS. 9A to 9D;

DESCRIPTION OF THE EMBODIMENTS

Embodiments of the present invention will be described below with reference to the accompanying drawings.

Figure 1A:
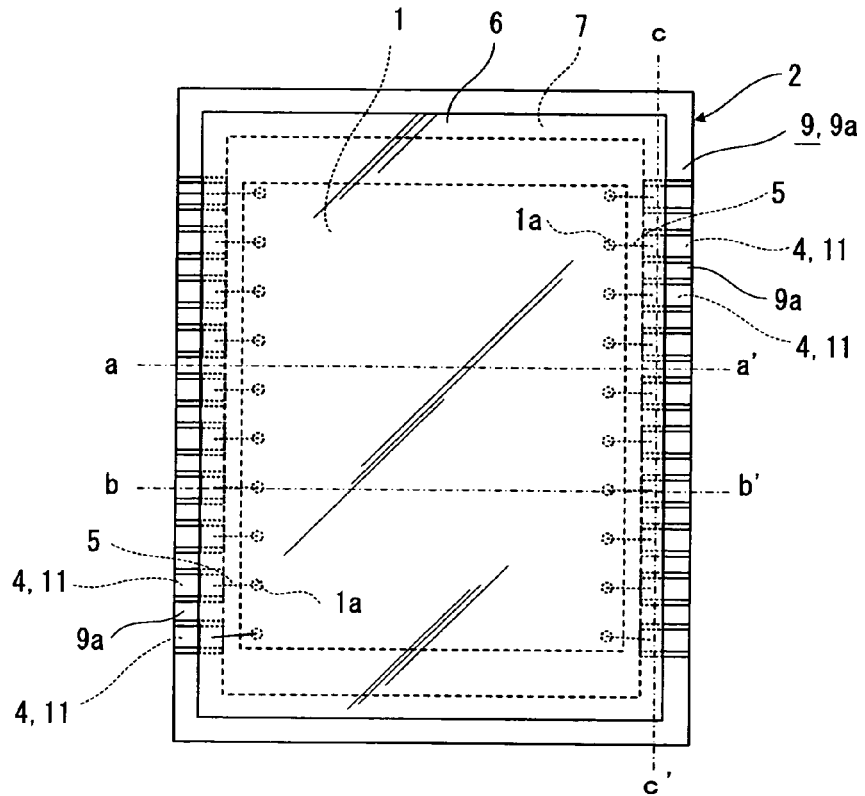
FIGS. 1A to 1D are diagrams showing the construction of a solid-state image pickup device which is a semiconductor device according to a first embodiment of the present invention.
Figure 1B:
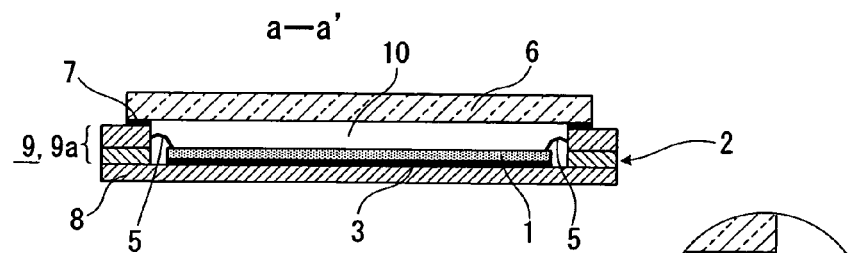
Figure 1C:
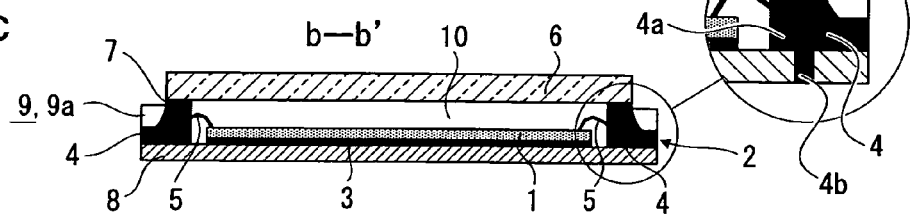
Figure 1D:
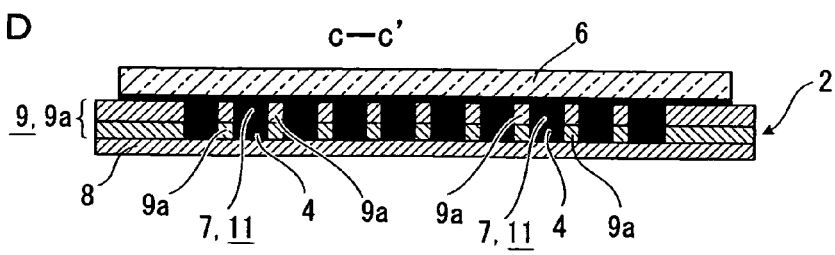

FIG. 1A is a plan view of the construction of a solid-state image pickup device which is a semiconductor device in a first embodiment of the present invention. FIGS. 1B to 1D are sectional views of the solid-state image pickup device taken along lines a-a', b-b' and c-c', respectively, in FIG. 1A.

Referring to FIGS. 1A to 1D, a solid-state image pickup element 1 is fixed on an inner bottom surface of a non-lead type of hollow package 2 (hereinafter referred to simply as package 2) by a paste-like fixing agent 3, and a plurality of electrode pads 1a formed on a peripheral portion of a major surface of the solid-state image pickup element 1 and a plurality of conductor portions 4 formed on the package 2 are respectively connected electrically to each other by thin metal wires 5. A cover glass 6 in the form of a flat plate having a predetermined thickness which is a transparent window member is bonded to an upper surface of the package 2 by a resin sealing material 7 to close the interior of the package 2 in an airtight manner.

The solid-state image pickup element 1 is a CCD or CMOS sensor type of solid-state image pickup element provided with an imaging circuit and a light receiving circuit. The solid-state image pickup element 1 may alternatively be a different type of image pickup element or a sensor element having a light receiving circuit or the like.

The package 2 has a base in which a frame member 9 is formed integrally on a peripheral portion of a base sheet 8 made of a ceramic material and a cavity 10 is formed inside the frame member 9, and a plurality of conductor portions 4 extending from the cavity 10 to an outer surface of the frame member 9.

As the paste-like fixing agent 3, an Ag paste formed of a thermosetting epoxy resin containing an Ag filler is used. As the thin metal wire 5, a wire made of a material containing Al or Au as a main component and having a diameter of about 10 to 100 µm is used. The material of the cover glass 6 is not necessarily a glass member. A transparent lid or the like made of a plastic, a hard-coated plastic or the like may alternatively be used.

This solid-state image pickup device differs from the conventional ones in that the package 2 has a plurality of channel portions 11 extending transversely through the frame member 9 in the widthwise direction, and the above-described conductor portions 4 are exposed in the bottom surfaces of the channel portions 11. In other words, a plurality of wall portions 9a are disposed on the upper surface of the base sheet 8 along the periphery of the base sheet 8 so as to form the cavity 10, and one conductor portion 4 is provided in each channel portion 11 formed as the gap between the wall portions 9a.

Each conductor portion 4 has a difference in level from the base sheet 8. Each conductor portion 4 includes an inner terminal portion 4a in the channel portion 11. A via 4b or the like exposed in a package bottom surface (back surface) is connected to each conductor portion 4. An external terminal (not shown) having a predetermined shape is formed on the exposed portion of the via 4b. The thin metal wires 5 for conduction to or from the solid-state image pickup element 1 are connected to the internal terminal portions 4a in the channel portions 11. The resin sealing material 7 is provided so as to cover connecting portions of the thin metal wires 5 and the internal terminal portions 4a and fill the spaces in the channel portions 11.

In the structure of this solid-state image pickup device, the region necessary for connection of the thin metal wires 5 from the solid-state image pickup element 1 to the conductor portions 4 and the region necessary for attachment of the cover glass 6 overlap each other to enable the solid-state image pickup device to be reduced in size in the longitudinal or vertical direction in comparison with the conventional types of solid-state image pickup device. The height of the device can also be reduced in comparison with that of the conventional device in which the electrodes and the thin metal wires are connected on the package side wall portions (corresponding to the frame member 9 in this embodiment).

More specifically, the size required for connecting the thin metal wires 5 to the conductor portions 4 (the size of the frame member 9 in the widthwise direction) is 0.4 mm. If the conventional type of solid-state image pickup device has the conductor portions 4 disposed along two opposite sides of the package 2 as illustrated, the necessary size for the connection is 0.4 mm×2 (places)=0.8 mm in the cavity 10. In the device of the present invention, no corresponding size in the cavity 10 is required since the connection is made in the channel portions 11 between the wall portions 9a. The corresponding reduction in overall size is ensured in the device of the present invention.

Since the connecting portions of the thin metal wires 5 and the conductor portions 4 are covered with the resin sealing material 7, the strength of connection therebetween is high and high connection reliability is ensured. Since the connecting portions are located in the channel portions 11 between the wall portions 9a, the wall portions 9a serve as support columns when the cover glass 6 is attached, thereby ensuring that the cover glass 6 can be easily fixed stably without deviating from the correct position in any of the X-, Y- and θ-directions. Further, since the size of the device is reduced relative to that of the conventional device as described above, the length of the electrical conduction path from each electrode pad 1a of the solid-state image pickup element 1 to the external terminal is reduced, thereby reducing the inductance of the path and, hence, the signal transmission loss.

In the illustrated solid-state image pickup device, the solid-state image pickup element 1 having a plurality of electrode pads 1a disposed along each of two opposite sides of the major surface is mounted. Accordingly, the package 2 having channel portions 11 and conductor portions 4 disposed only at the two corresponding sides is used. In a case where a solid-state image pickup element 1 having electrode pads 1a arranged along the four sides of the major surface is mounted, a package 2 having channel portions 11 and conductor portions 4 disposed along the four sides may be used to obtain the same effect.

Figure 8A:
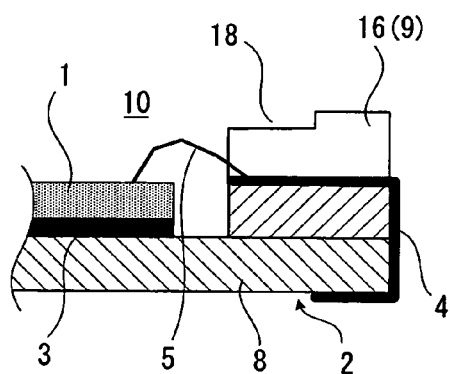
FIGS. 8A and 8B are sectional views showing details of another solid-state image pickup device in accordance with the present invention.
Figure 8B:
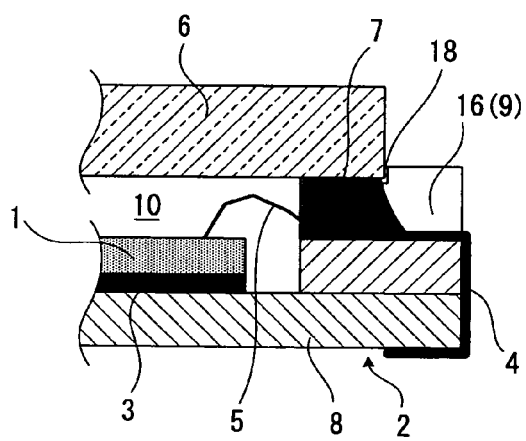

In the illustrated solid-state image pickup device, the conductor portions 4 have the above-described structure because the package 2 is formed as a non-lead type. However, leads extending from positions in the channel portions 11 to the outside of the package 2 may be provided as the conductor portions 4. In such a case, the leads may be bent along the package external side surface to enable external terminal portions to be disposed on the package bottom surface (see FIG. 8 referred to below).

A first method of manufacturing the solid-state image pickup device shown in FIGS. 1A to 1D will be described.

Figure 2A:
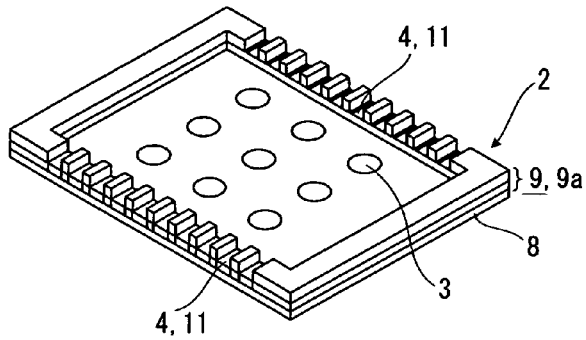
FIGS. 2A to 2E' are diagrams for explaining a first method of manufacturing the solid-state image pickup device shown in FIGS. 1A to 1D.

As shown in FIG. 2A, the above-described package 2 is prepared. As a ceramic provided as the material of the base sheet 8 and the frame member 9 of the package 2, alumina ceramic ($Al_2O_3$), mullite ceramic ($3Al_2O_3 \cdot 2SiO_2$), a glass ceramic material or the like which is typically used in this kind of package is used. Each conductor portion 4 is formed, for example, by a method of plating a Cu or Mo—Mn metalized film with Ni—Au, plating a W metalized film with Ni—Au or plating a Cr—Cu metalized film with Ni—Au.

The paste-like fixing agent 3 is applied, for example, to a plurality of portions of the device mount region on the inner bottom surface of the prepared package 2 (dice bonding pre-process step). To apply the paste-like fixing agent 3, a method of applying the agent from multiple nozzles attached to a dispenser or the like or a method of transferring the agent from a transfer member attached to a stamper may be used. It is desirable to perform this operation in a clean room the interior of which is cleaned and humidity/temperature controlled so that any dust, film or the like is not attached to any of the cavity 10, the channel portions 11 and the conductor portions 4.

Figure 2D:
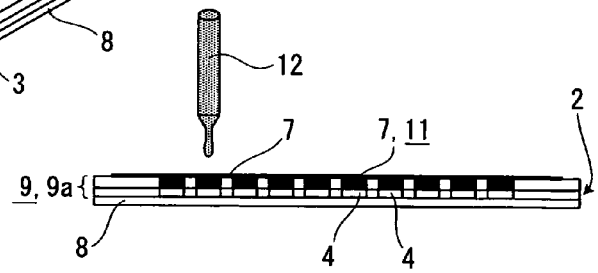
Figure 2B:
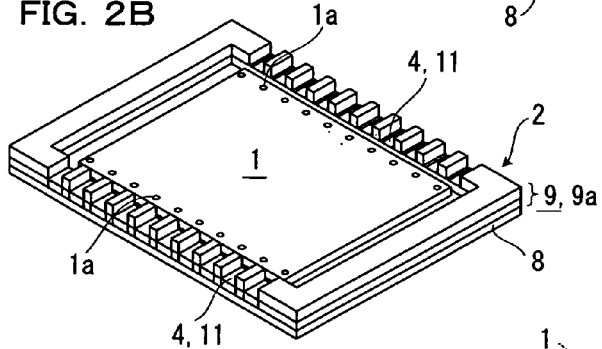

As shown in FIG. 2B, the solid-state image pickup element 1 is mounted on the element mount region in the package 2 (dice bonding post process step).

The solid-state image pickup element 1 is formed, for example, by forming a light receiving circuit or the like in an Si wafer state by a stepper or the like, forming a light-collecting micro-lens in a layer on the circuit (on-chip process step), grinding the wafer back surface to a predetermined thickness (back grinding process step) and thereafter attaching a dicing sheet to the ground Si wafer and dividing into separate pieces.

Each of the solid-state image pickup elements 1 divided into separate pieces are picked up and mounted by a jig called a collet. The solid-state image pickup element 1 is scrubbed (swung) in all directions by an amount of several ten microns to enable the paste-like fixing agent 3 applied on the element mount region to spread over the back surface of the solid-state image pickup element 1. At this time, the two-dimensional position in the X- and Y-directions and the height and inclination from a reference plane on the solid-state image pick up element 1 are adjusted with reference to a certain portion of the package 2 (e.g., the upper surfaces of the wall portions 9a) so as to ensure accuracy within specified limits. The paste-like fixing agent 3 is then set by heating at 100 to 200° C., thereby fixing the solid-state image pickup element 1 on the device mount region. A method of attaching a bonding sheet to the back surface of the solid-state image pickup element 1 and fixing the image pickup element by means of the bonding sheet may be used instead of application of the paste-like fixing agent 3 on the element mount region.

Figure 2E:
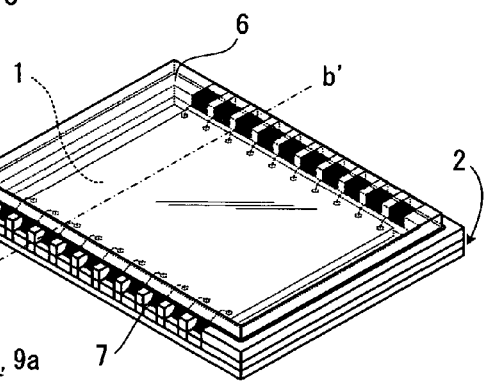
Figure 2C:
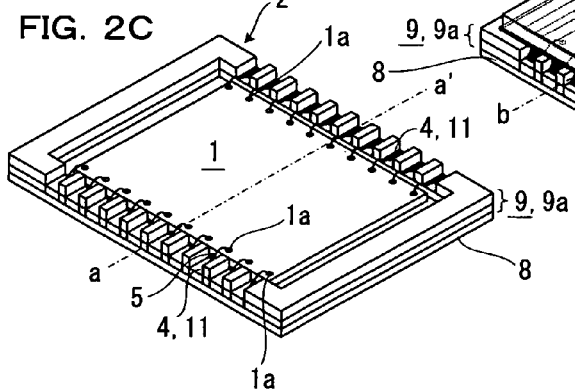
Figure 2C:
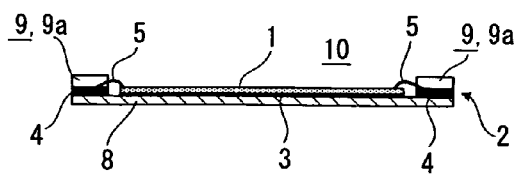
Figure 2E:
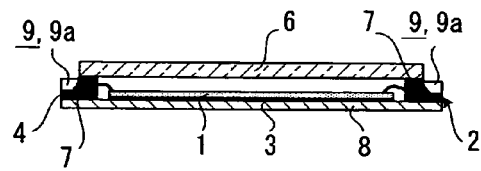

As shown in FIGS. 2C and 2C', the inner terminal portions (not shown) in the conductor portions 4 of the package 2 and the electrodes pads 1a of the solid-state image pickup element 1 are electrically connected to each other by thin metal wires 5 (wire bonding step).

If an Au wire is used as thin metal wire 5, it is connected by an ultrasonic thermocompression method (ball bonding method) That is, an Au wire is passed through a hole formed in a jig in the form of a cone called a capillary, and the tip of the wire is molten into a spherical shape by electric discharge and joined to the electrode pad 1a by being thermocompressed (at 150 to 200° C.) on the electrode pad 1a under application of ultrasonic waves, with Au alloyed with the material of the electrode pad 1a. The Au wire is further led to the conductor portion 4 and joined to the same under application of ultrasonic vibration and thereafter cut by the edge of the capillary. An Au wire having a diameter of 10 to 30 μm is ordinarily used.

If an Al wire is used as thin metal wire 5, it is connected by using a wedge bonding method. That is, a jig called a wedge bonding tool is used to join the electrode pad 1a and the conductor portion 4 to each other under ultrasonic vibration at ordinary temperature. An Al wire having a diameter of 20 to 100 μm is ordinarily used. This wedge bonding method has the advantage of avoiding subjecting the electrode pads 1a and so on to heat at a high temperature in comparison with the ball bonding method. However, since the tool can be moved only in one direction, it is necessary to rotate the mount on which the package 2 is fixed or the bonding head, thus requiring tact.

As shown in FIG. 2D, a paste-like resin sealing material 7 having a thermosetting property, an ultraviolet curing property or both these properties, e.g., a thermosetting epoxy resin is applied to the channel portions 11 in which the connections between the conductor portions 4 and the thin metal wires 5 exist, and to the upper surfaces of the wall portions 9a (resin application step).

Two methods are conceivable as a method for this step. The first method is a method of applying the resin sealing material 7 from a nozzle 12 attached to a dispenser so as to fill the channel portions 11 and cover the upper surfaces of the wall portions 9a. Application to the upper surfaces of the wall portions 9a is performed in a drawing manner along a region defined as a sealing portion on which the cover glass 6 is placed. The amount of the resin sealing material 7 is set to a suitable value such that the resin sealing material 7 does not flow out of the sealing portion or the channel portions 11.

In the second method, the channel portions 11 are first filled with the resin sealing material 7; the resin sealing material 7 in the channel portions 11 is set by heat or ultraviolet rays; and the resin sealing material 7 is thereafter applied uniformly to the upper surfaces of the wall portions 9a and the upper surfaces of the resin sealing material 7 in the channel portions 11.

Selection of one of the first method and the second method (using a larger number of process steps) may be made by considering the depth and the number of channel portions 11, whether or not airtight sealing with the cover glass 6 in the next step can be performed with reliability, and so on. Each of the first and second methods ensures strong connection and high connection reliability since the connections between the thin metal wires 5 and the conductor portions 4 are covered with the resin sealing material 7. The same resin sealing material 7 may be applied to the interiors of the channel portions 11 and the upper surfaces of the wall portions 9a or different resin sealing materials 7 may be respectively applied. Resin sealing materials 7 differing in composition and viscosity may be selected according to the purposes and conditions of use of them.

As shown in FIGS. 2E and 2E', the cover glass 6 is attached the surface of the resin sealing member 7 applied to the upper surfaces of the wall portions 9a of the package 2, and the resin sealing member 7 is set by heat or ultraviolet rays (sealing step).

In this step, the cover glass 6 is temporarily fixed so that its surface is parallel to a reference surface of the package 2 (e.g., the upper surfaces of the wall portions 9a), the resin sealing material 7 is set by radiating ultraviolet rays from above the cover glass 6 in this state or by heating the material, thereby fixing the cover glass 6 with reliability. It is effective to use the resin sealing material 7 with which a moisture proofing agent or the like is blended in not presenting degradation of the airtight and moisture proof properties.

A second method of manufacturing the solid-state image pickup device shown in FIGS. 1A to 1D will be described.

Figure 3A:
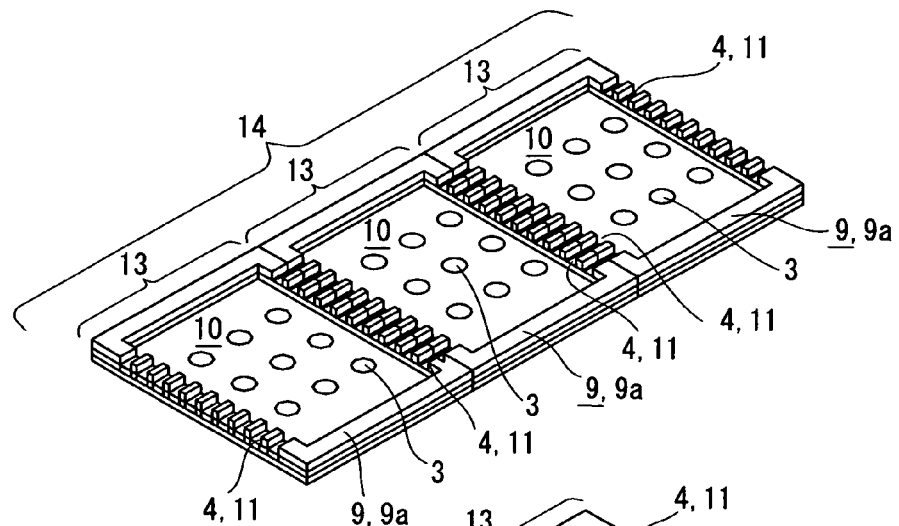
FIGS. 3A to 3C' are diagrams for explaining the first half of the process according to a second method of manufacturing the solid-state image pickup device shown in FIGS. 1A to 1D.

As shown in FIG. 3A, a block sheet 14 in which a plurality of package units 13 are arranged at least in one direction is prepared (although a single row of package units is shown here). The package unit 13 corresponds to the above-described package 2. Each adjacent pair of package units 13 have their base sheets 8, frame members 9, channel portions 9 and conductor portions 4 formed continuously with each other. The block sheet 14 may be formed together with the base sheet 8 and the frame member 9 by using a ceramic material, or the frame member 9 with channel portions may be formed by injection molding an epoxy resin on the base sheet 8 made of a ceramic.

The paste-like fixing agent 3 is applied to the interiors of the cavities 10 of the package units 13 in the prepared block sheet 14.

Figure 3B:
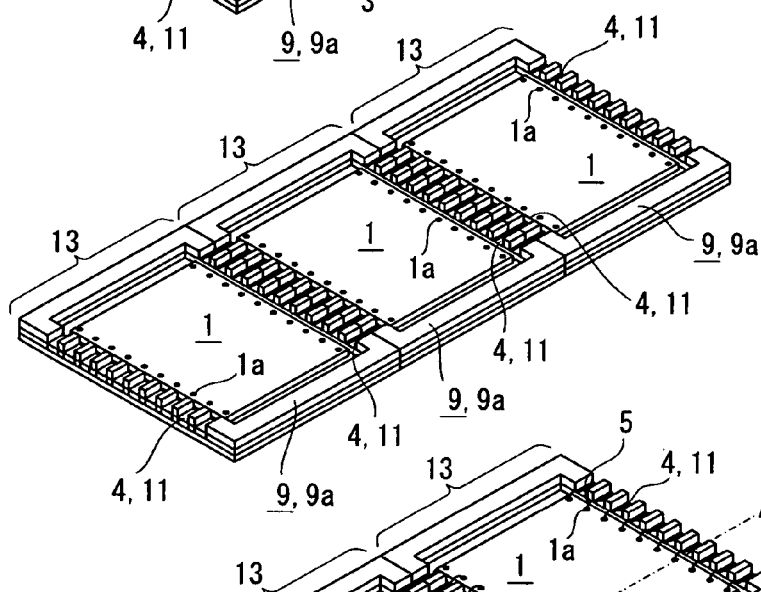

As shown in FIG. 3B, the solid-state image pickup elements 1 are mounted and fixed in the inner portions of the package units 13 to which the paste-like fixing agent 3 has been applied.

Figure 3C:
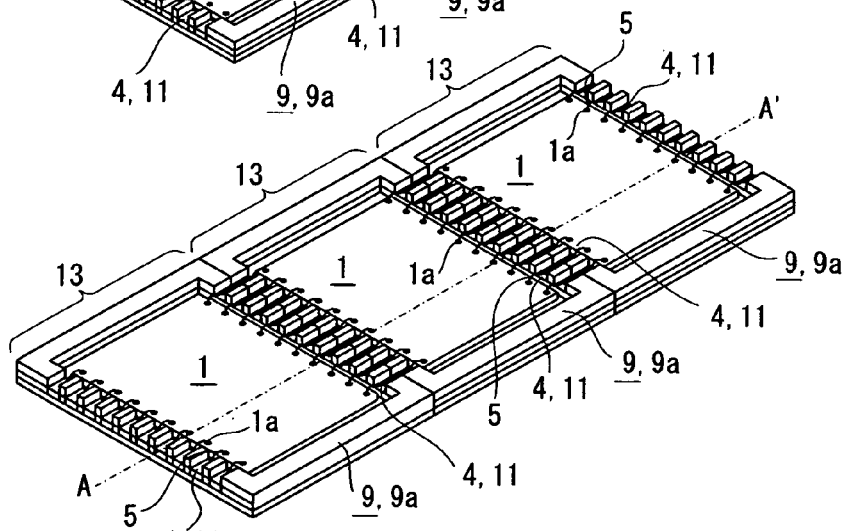
Figure 3C:
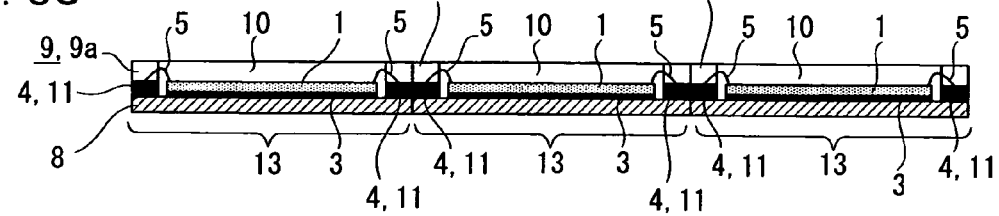

As shown in FIGS. 3C and 3C', the conductor portions 4 of the package units 13 and the electrode pads 1a of the solid-state image pickup elements 1 are connected to each other by thin metal wires 5.

Figure 4A:
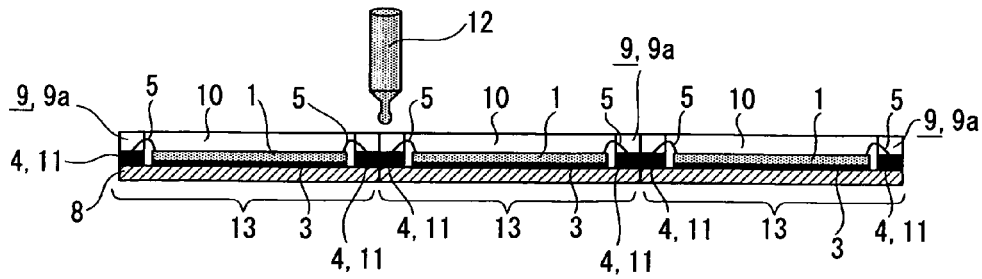
FIGS. 4A to 4D' are diagrams for explaining the second half of the process according to the second method of manufacturing the solid-state image pickup device shown in FIGS. 1A to 1D.
Figure 4B:
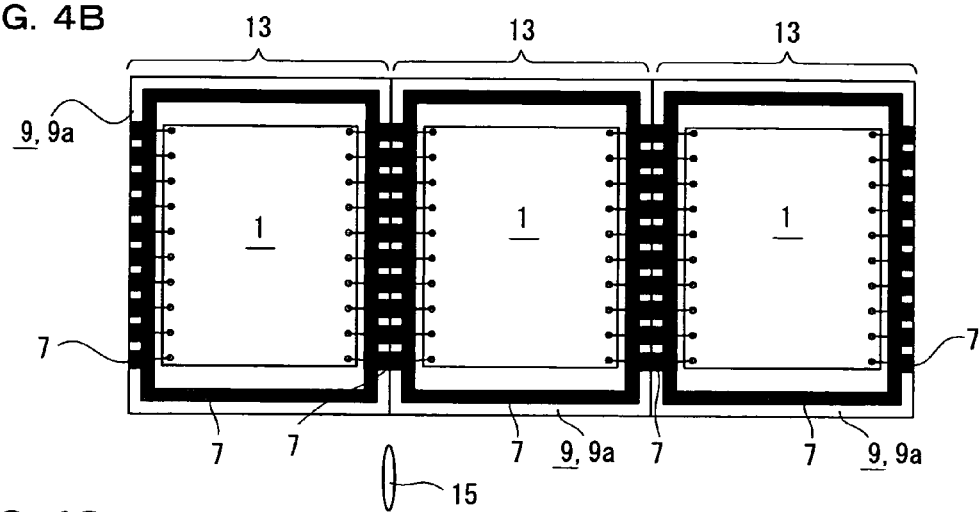

As shown in FIGS. 4A and 4B, the paste-like resin sealing material 7 having a thermosetting property, an ultraviolet curing property or both these properties is applied to the interiors of the channel portions 11 and to the upper surface of the frame member 9 (i.e., the wall portions 9a).

In this step, the resin sealing material 7 may be simultaneously applied to the interiors of the channel portions 11 and to the upper surfaces of the wall portions 9a or may be applied first to the interiors of the channel portions 11 and subsequently to the upper surfaces of the wall portions 9a. However, the resin sealing material 7 maybe simultaneously applied to the channel portions 11 formed continuously with each other in each adjacent pair of the package units 13. A groove or a recess (not shown) may also be formed for a resin pool at the boundaries between the package units 13 to control variation of the amount of application of the resin sealing material 7.

Figure 4C:
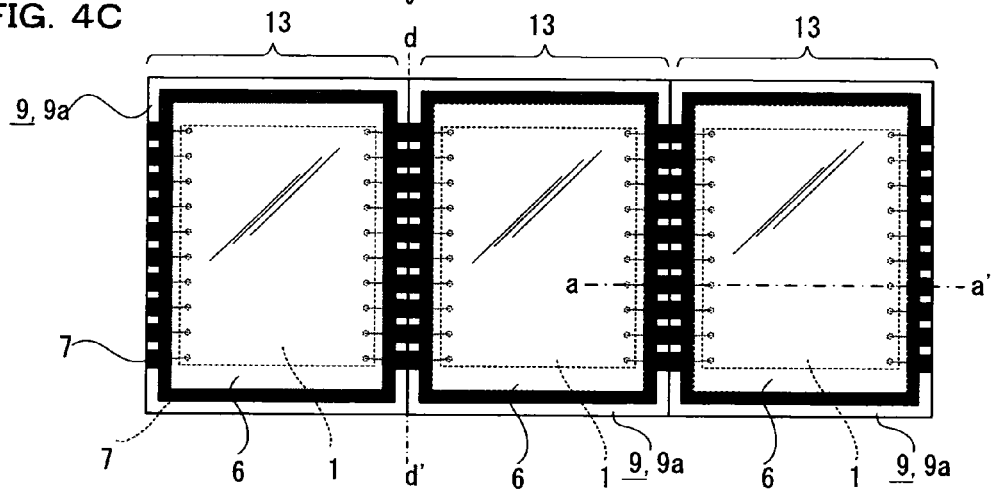

As shown in FIG. 4C, the cover glass 6 is attached to the upper surfaces of the wall portions 9a of each package unit 13 and to the surface of the resin sealing member 7 between each pair of the wall portions 9a, and the resin sealing member 7 is set.

Figure 4D:
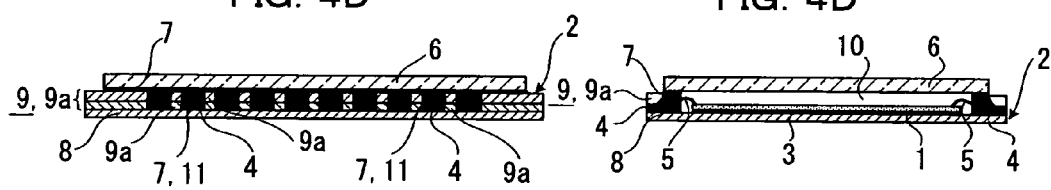
Figure 4D:
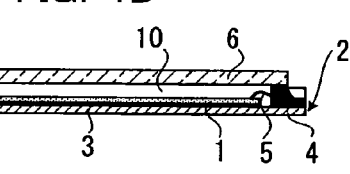

Thereafter, the block sheet 14 is divided into pieces corresponding to the package units 13 by using a dicing blade 15, thereby obtaining the solid-state image pickup devices, such as shown in FIGS. 4D and 4D', in each of which the solid-state image pickup element 1 and the cover glass 6 are mounted in or on the individual package 2.

At the time of dividing, the block sheet 14 is attached to a dicing tape (not shown) and cut with the dicing blade 15 rotated at a speed of several ten thousands of revolutions per minute, while being showered with water. In a case where a groove or a recess is formed for a resin pool at the boundaries between the package units 13, it can be cut and removed at the time of this dividing. A dicing tape formed by applying an UV adhesive on an elastic resin base made of polyvinyl chloride or polyolefin may be used. Also, a dicing blade 15 having a bond containing diamond abrasive grains may be used.

The second manufacturing method, i.e., the method of mounting solid-stage image pickup elements 1 and cover glasses 6 on the block sheet 14 and dividing the block sheet 14 into pieces corresponding to the package units 13, improves the manufacturing efficiency in comparison with the first manufacturing method in which packages 2 are handled one after another. In the divided individual packages 2, the outer surfaces of the wall portions 9a and the outer surfaces of the resin sealing material 7 in the channel portions 11 are flush with each other, thus creating a finely-finished good contour. Also, the reliability of the product is improved because water cannot easily permeate into the package through the boundary between the wall portions 9a and the resin sealing material 7 in the channel portions 11. Also, advantageously, this manufacturing method facilitates positioning of the solid-state image pickup device when the device is mounted in an appliance.

Figure 5A:
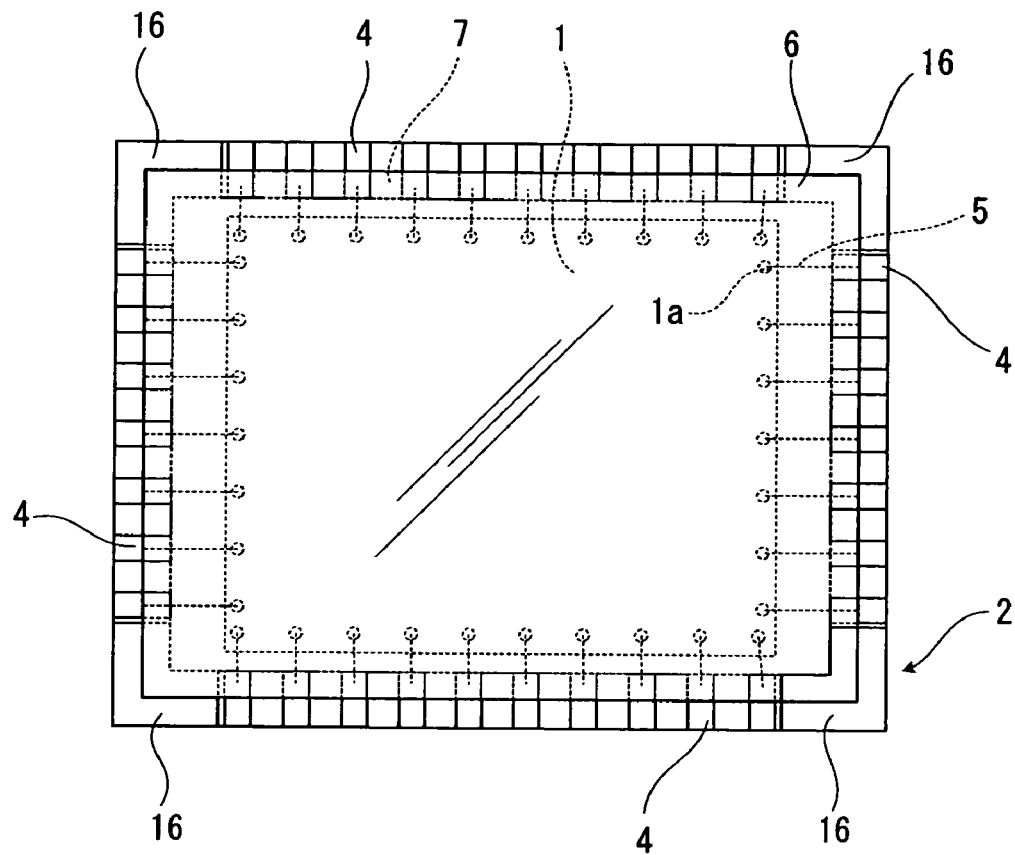
FIGS. 5A and 5B are diagrams showing the construction of a solid-state image pickup device which is a semiconductor device according to a second embodiment of the present invention.

FIG. 5A is a plan view of the construction of a solid-state image pickup device in a second embodiment of the present invention. FIG. 5A is a sectional view of the solid-state image pickup device shown in FIG. 5A.

This solid-state image pickup device differs from that of the first embodiment in that the package 2 is formed by integrally forming L-shaped wall portions 16 on four corner portions of a base sheet 8, and that a plurality of conductor portions 4 are arranged in the space between each adjacent pair of the wall portions 16 while being spaced apart from each other. The resin sealing material 7 is implanted in the spaces between the wall portions 16 so as to cover the connections between the conductor portions 4 and thin metal wires 5 and is applied to the upper surfaces of the wall portions 16, and the cover glass 6 is attached to the surface of the applied resin sealing material 7.

This solid-state image pickup device has the same advantages as those of the solid-state image pickup device of the first embodiment and can have a reduced pitch between the conductor portions 4 in comparison with the solid-state image pickup device of the first embodiment. The reason is as follows. In the structure of the first embodiment in which the conductor portions 4 are disposed in the channel portions 11 between the wall portions 9a arranged so as to form the shape of a frame, it is at least necessary that each channel portion 11 have a size large enough to ensure that the jig for connection of the thin metal wire 5 can enter the channel portion 11. In the structure of the second embodiment in which the wall portions 16 exist only at the four corners, it is not particularly necessary to consider the selection of the size for entrance of the jig. For example, if the upper limit of the pitch between the conductor portions 4 is 0.8 mm, the pitch can be reduced to 0.4 mm in the second embodiment shown in FIGS. 5A and 5B.

The desired degree of parallelism between the cover glass 6 and the solid-state image pickup element 1 can be maintained by using the upper surfaces of the wall portions 16 at the four corners, as in the first embodiment using the upper surfaces of the wall portions 9a as a position regulating portion.

Figure 5B:
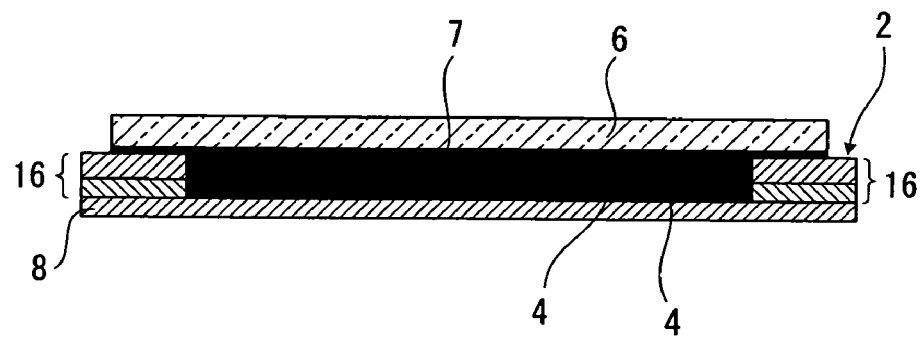

In the solid-state image pickup device shown in FIGS. 5A and 5B, the package 2 having the conductor portions 4 placed along the four sides corresponding to the four sides of the major surface of the solid-state image pickup element 1 to be mounted is used since the solid-state image pickup element 1 has electrode pads 1a disposed along the four sides of its major surface. In a case where a solid-state image pickup element 1 having electrode pads 19 disposed only along a pair of opposite sides of the major surface is mounted, a package 2 having conductor portions 4 placed along the corresponding two sides may be used.

A method of manufacturing the solid-state image pickup device shown in FIGS. 5A and 5B will be described.

Figure 6A:
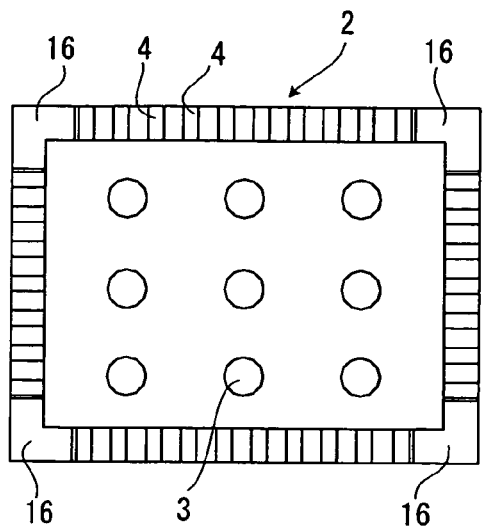
FIGS. 6A to 6D are diagrams for explaining a method of manufacturing the solid-state image pickup device shown in FIGS. 5A and 5B.

As shown in FIG. 6A, the above-described package 2 is prepared, and the paste-like fixing agent 3 is applied, for example, a plurality of portions of the device mount region on the inner bottom surface of the package 2. The package 2 may be formed only of a ceramic, as is that in the first embodiment. The package 2 may alternatively be formed of a ceramic and an epoxy resin injection molded to form the wall portions 16.

Figure 6B:
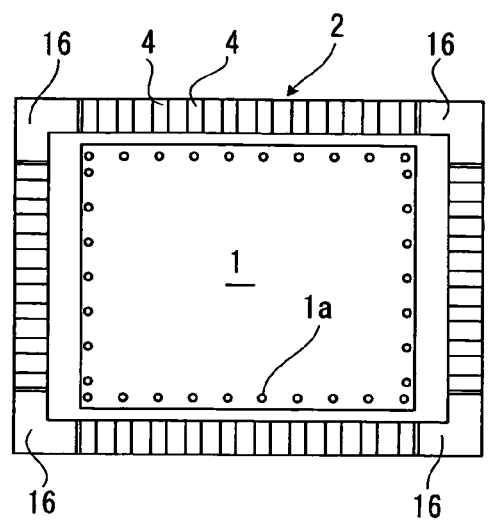

The solid-state image pickup element 1 is mounted and fixed on the package 2 to which the paste-like fixing agent 3 is applied as shown in FIG. 6B.

Figure 6C:
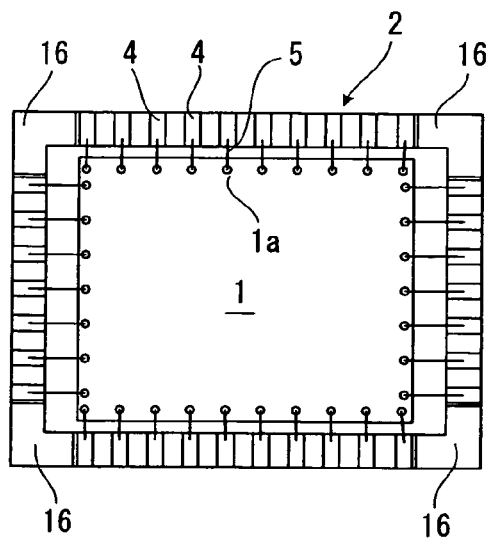

As shown in FIG. 6C, the conductor portions 4 of the package 2 and the electrode pads 1a of the solid-state image pickup element 1 are connected by thin metal wires 5.

Figure 6D:
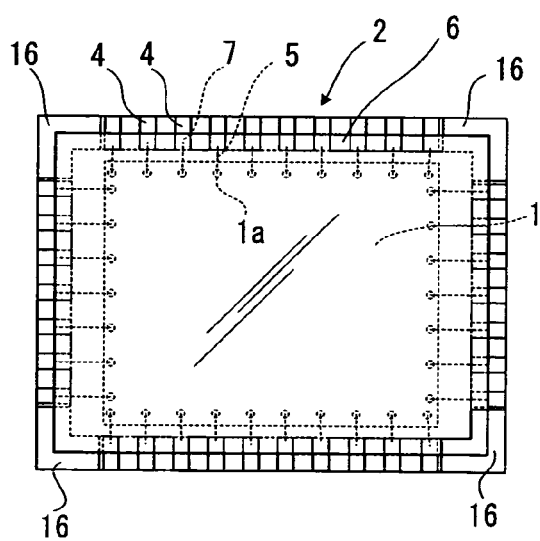

As shown in FIG. 6D, the paste-like resin sealing material 7 having a thermosetting property, an ultraviolet curing property or both these properties is applied to the members between the wall portions 16 of the package 2 so as to cover the connecting portions of the thin metal wires 5 and the conductor portions 4 and fill the spaces therebetween, and is also applied to the upper surfaces of the wall portions 16, and the cover glass 6 is attached from above the applied resin sealing material 7.

Figure 7A:
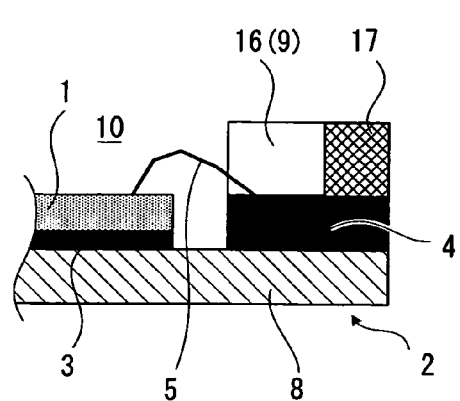
FIGS. 7A and 7B are sectional views showing details of a solid-state image pickup device in accordance with the present invention.
Figure 7B:
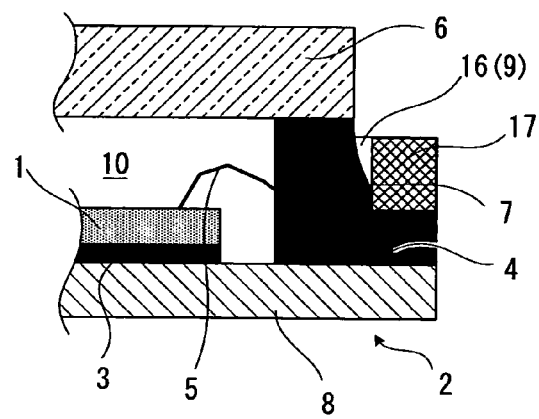

Implanting the resin sealing material 7 between the wall portions 16 so that the implanted resin sealing material 7 is uniform in height is more difficult than implanting the resin sealing material 7 in the channel portions 11 in the first embodiment. A step portion 17 may therefore be provided as a sealing material stop in outer peripheral end portions of the spaces between the wall portions 16, as shown in FIGS. 7A and 7B. This structure may be applied to the frame member 9 (i.e., wall portions 9a).

Alternatively, for the purpose of implanting the resin sealing material 7 between the wall portions 16 so that the implanted resin sealing material 7 is uniform in height, step portions 18 for positioning the cover glass 6 may be provided in the wall portions 16 at the inner peripheral side of the same, and the resin sealing material 7 may be pressed by the cover glass 6 fitted to the step portions 18. Leads are used as the conductor portions 4 in this embodiment.

Also, for the purpose of simply positioning the cover glass 6, projections (not shown) may be provided on peripheral portions of the cover glass 6, and step portions (not shown) to which the projections can be fitted may be provided in the outer peripheral surfaces or the upper surfaces of the wall portions 16.

While the description has been made of the solid-state image pickup device, the above-described structure and manufacturing method can also be applied to optical devices other than the solid-state image pickup device and to semiconductor devices other than the optical devices, e.g., a device having a sensor element using gravity (acceleration), electric waves or sound (typified by a micro-electro-mechanical system (MEMS)). In the case of a non-optical device, a non-transparent lid plate may be used in place of the cover glass 6.

Figure 9A:
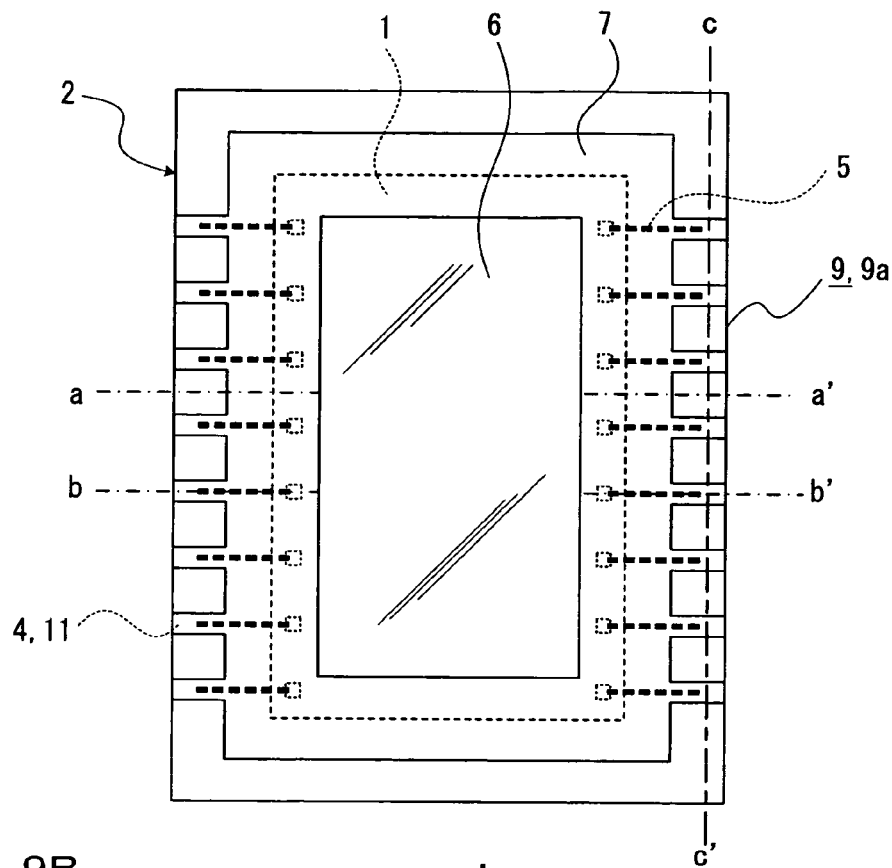
FIG. 9A to 9D are diagrams showing the construction of a solid-state image pickup device which is a semiconductor device according to a third embodiment of the present invention.
Figure 9B:
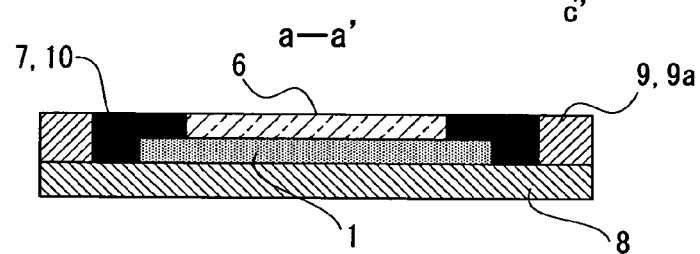
Figure 9C:
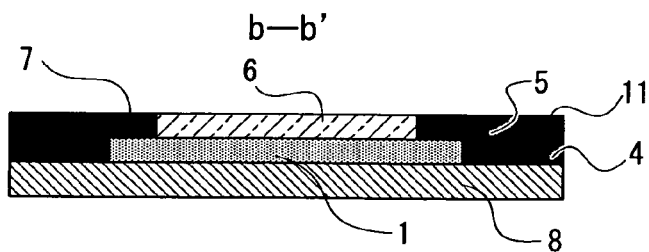
Figure 9D:
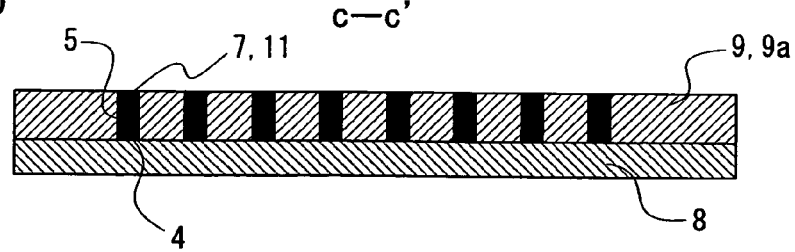

FIG. 9A is a plan view of the construction of a solid-state image pickup device in a third embodiment of the present invention. FIGS. 9A to 9D are sectional views taken along lines a-a', b-b', and c-c', respectively, in FIG. 9A.

This solid-state image pickup device differs from that in the first embodiment in that the cover glass 6 is attached on the solid-state image pickup element 1 instead of being fixed on the upper surfaces of the wall portions 9a and the resin sealing material 7 between the wall portions 9a, and that the portions of the cavity 10 around the cover glass 6 and the solid-state image pickup element 1 is filled with the resin sealing material 7 up to the position of the upper surface of the cover glass 6. This structure eliminates the need for the spacing between the solid-state image pickup element 1 and the cover glass 1 and enables the solid-state image pickup device to be correspondingly reduced in height in comparison with that of the first embodiment.

A first method of manufacturing the solid-state image pickup device shown in FIG. 9A to 9D will be described.

As shown in FIG. 10A, the same block sheet 14 as that described above with reference to FIGS. 3A to 3C' is prepared. Integral articles in each of which the cover glass 6 is placed on the solid-state image pickup element 1 are also prepared. The surface of the cover glass is covered with a cover sheet 19.

A paste-like fixing agent (not shown) is applied to the interior of in the cavity 10 of each package 13, and the integral article including the solid-state image pickup element 1, the cover glass 6 and the cover sheet 19 is fixed in the package unit 13, with the solid-state image pickup element 1 set in the lower position, as shown in FIG. 10B.

As shown in FIG. 10C, the electrode pads (not shown) of the solid-state image pickup element 1 and the conductor portions 4 are connected to each other by thin metal wires 5 in each package unit 13.

Thereafter, the paste-like resin sealing material 7 having a thermosetting property, an ultraviolet curing property or both these properties is applied to the interior of the portion of the cavity 10 around the cover glass 6, the solid-state image pickup element 1 and the cover sheet 19 and the channel portions 11 between the wall portions 9a to fill the cavity 10 and the channel portions 11. The amount of resin sealing material 7 is set to such a value that the position of the upper surface of the cover glass 6 is reached.

After setting the resin sealing material 7, the cover sheet 19 is removed and the resin sealing material 7 is caused to fall to concavities formed in the resin sealing material 7 around the cover glass 6 and in the channel portions 11 to make the surface of the resin sealing material 7 uniform, as shown in FIG. 10D (potting sealing step). The resin sealing material 7 used in this method is, for example, a thermosetting epoxy resin which is in liquid form at ordinary temperature (room temperature) and is set at 100 to 150° C. in 0.5 to 1 hour.

After setting of the resin sealing material 7, the block sheet 14 is divided into pieces corresponding to the package units 13 by using a dicing blade 15, thereby obtaining the solid-state image pickup devices, such as shown in FIG. 10F, in each of which the solid-state image pickup element 1 and the cover glass 6 are mounted in or on the individual package 2.

This manufacturing method further improves the manufacturing efficiency in comparison with the method described above with reference to FIGS. 3 and 4.

A second method of manufacturing the solid-state image pickup device shown in FIGS. 9A to 9D will be described.

Figure 11A:
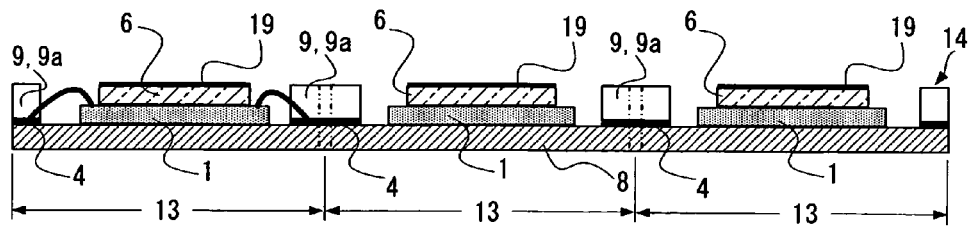
FIGS. 11A to 11D are diagrams for explaining a second method of manufacturing the solid-state image pickup device shown in FIGS. 9A to 9D.

As shown in FIG. 11A, the paste-like fixing agent 3 is applied to the interior of in the cavity 10 of each package 13; the integral article including the solid-state image pickup element 1, the cover glass 6 and the cover sheet 19 is fixed in the package unit 13, with the solid-state image pick up element 1 set in the lower position; and the electrode pads (not shown) of the solid-state image pickup element 1 and the conductor portions 4 are connected to each other by thin metal wires 5, as in the process described above with reference to FIGS. 10A, 10B, and 10C.

Figure 11B:
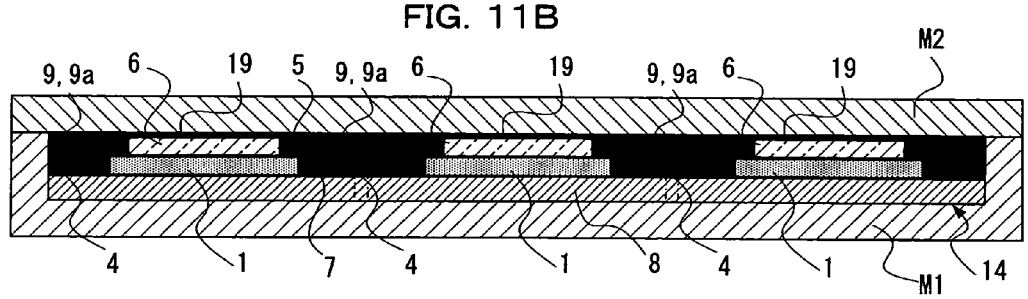

Subsequently, as shown in FIG. 11B, in a state where the block sheet 14 is set in molding dies M1 and M2; cover sheets 19 are attached to the upper surfaces of the wall portions 9a if necessary; and the cover glasses 6 and the wall portions 9a are pressed by the upper molding die M1 through the cover sheets 19 interposed therebetween, the resin sealing material 7 is pressure-injected into the cavity between the upper and lower molding dies M1 and M2 to enter and fill the spaces between the wall portions 9a and the spaces around the integral article including the solid-state image pickup element 1, the cover glass 6 and the cover sheet 19 in each package unit 13, followed by setting of the resin sealing material 7. The resin sealing material 7 used in this method is, for example, a thermosetting epoxy resin which is liquefied at 120 to 200° C. and thereafter set at a high temperature (a step of sealing by a transfer molding method).

The molding dies M1 and M2 are provided with a gate (resin injection port) (not shown) at a predetermined position. The gate is connected to a pot by a runner (resin path). The molding dies M1 and M2 are heated to a predetermined temperature. The runner and the pot are also heated to 150 to 200° C. in advance. When in this state the epoxy resin in tablet form is put in the pot and forced in by a plunger, the epoxy resin moves while being molten by heat from the pot and the molding dies M1 and M2, passes through the runner and then through the gate, and flows into the cavity between the molding dies M1 and M2. As the resin moves in this way, air is expelled through an air vent opposite from the gate.

Figure 11C:
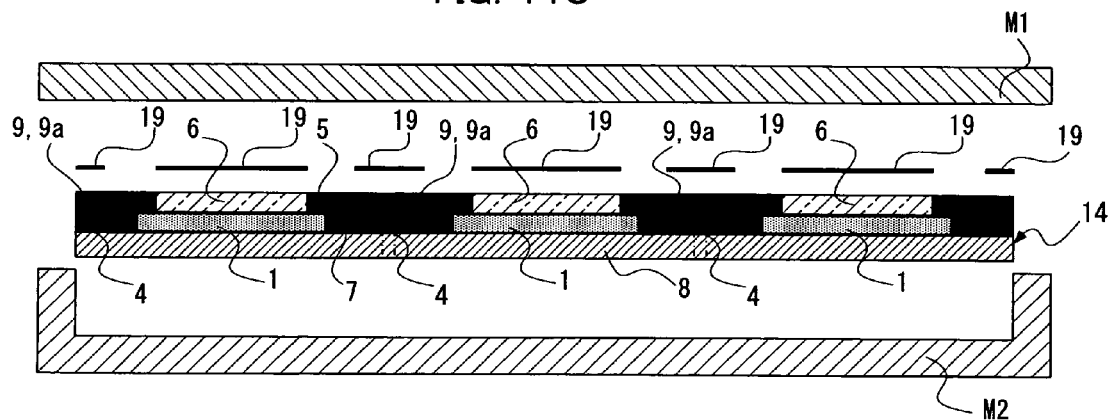
Figure 11D:
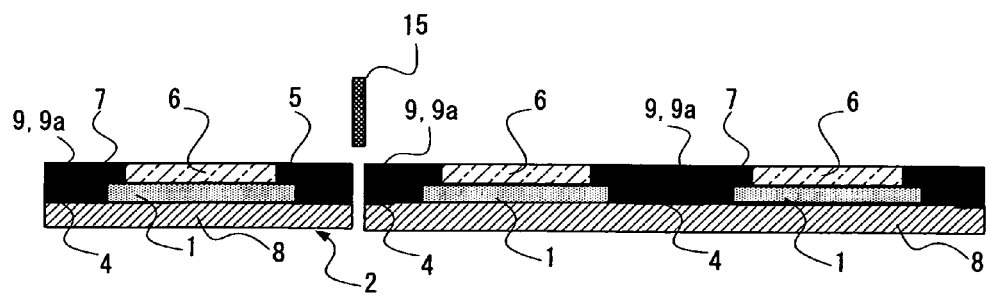

As shown in FIG. 11C, the block sheet 14 sealed with the resin sealing material 7 is taken out of the molding dies M1 and M2 and the cover sheets 19 are removed. Thereafter, the block sheet 14 is divided by the dicing blade 15 to obtain the solid-state image pickup devices in each of which the solid-state image pickup element 1 and the cover glass are mounted in or on the individual package 2.

This manufacturing method uses a transfer molding method and, therefore, does not require an accurate mask necessary for projecting the optical portion of the solid-state image pickup element 1 in the case of ultraviolet setting with use of an application method. Also in this manufacturing method, the cover glass 6 is covered with the cover sheet 19 to avoid formation of resin burrs.

Since the resin sealing material 7 is pressure-injected and set while the cover glass 6 is being pressed by the upper molding die M1 through the cover sheet 19, the resin sealing material 7 is filled to the level corresponding to the upper surface of the cover glass 6; the degree of flatness of the upper surface of the resin sealing material 7 is improved relative to that in the case of implanting a potting resin; and the sloping portion gently sloping down from the boundary on the cover glass 6 completely covers the side surfaces of the cover glass 6. As a result, the surface of the cover glass 6 and the surfaces of the resin sealing material 7 and the wide wall portions 9a around the cover glass 6 are generally flush with each other, thus creating a finely-finished good contour.

Figure 12A:
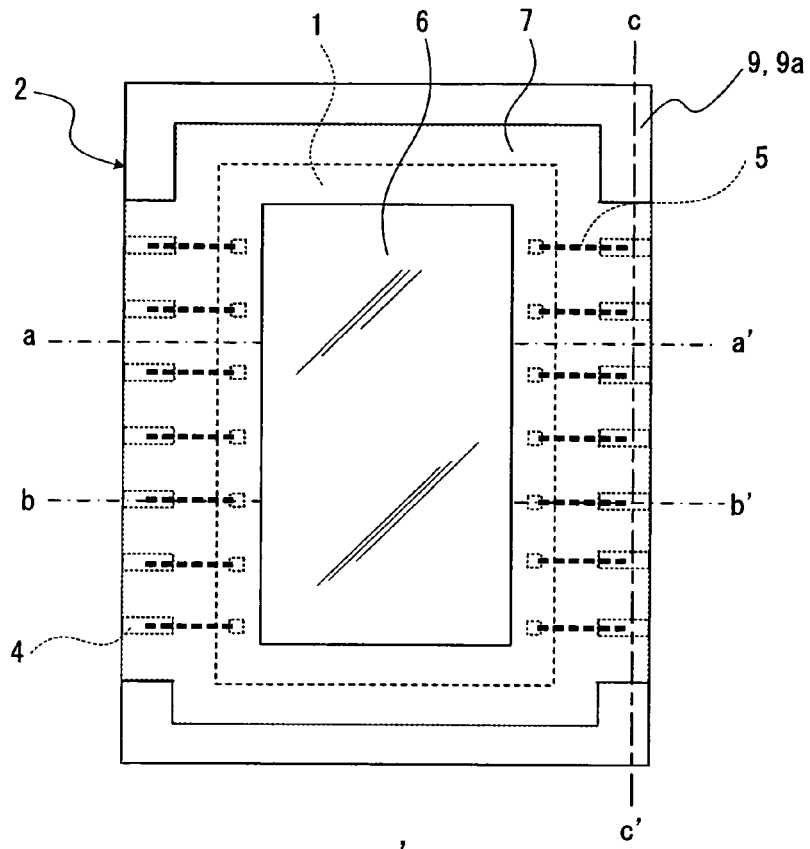
FIG. 12A to 12D are diagrams showing the construction of a solid-state image pickup device which is a semiconductor device according to a fourth embodiment of the present invention.
Figure 12B:
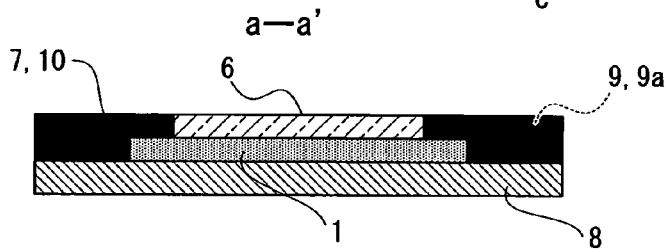
Figure 12C:
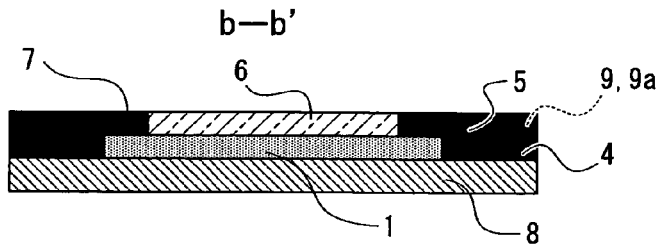
Figure 12D:
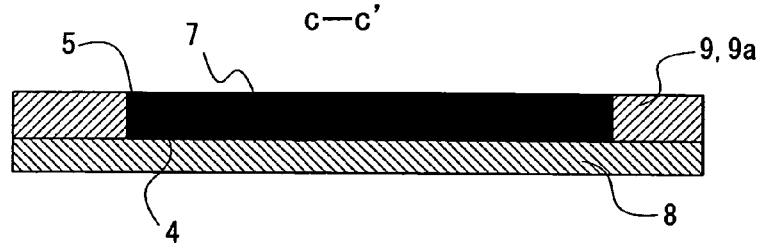
Figure 13A:
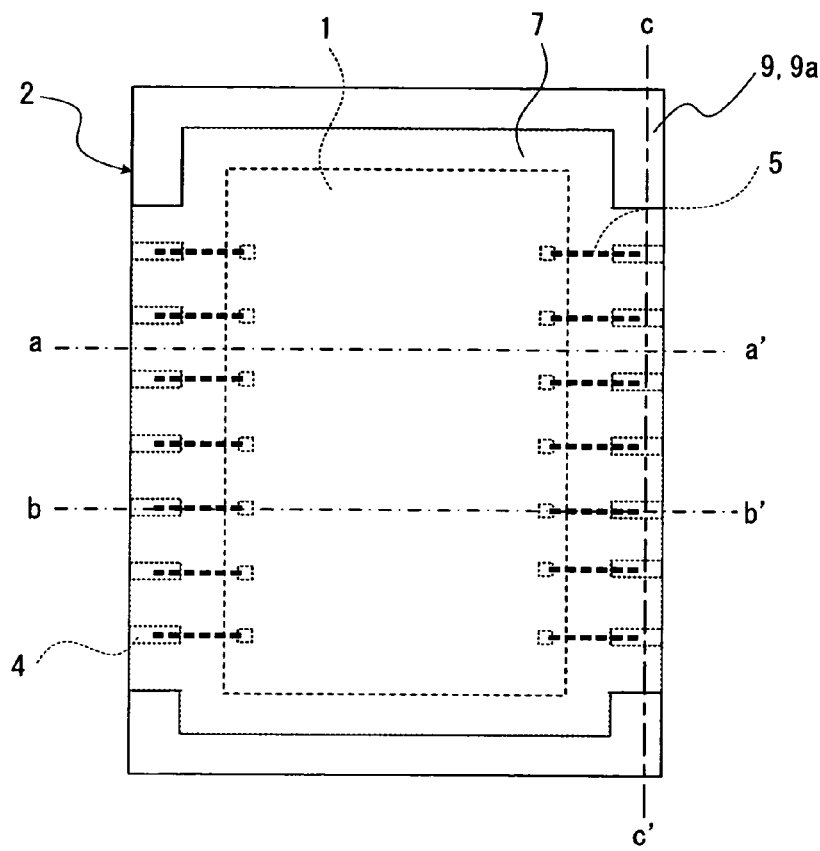
FIG. 13A to 13D are diagrams showing the construction of a solid-state image pickup device which is a semiconductor device according to a fifth embodiment of the present invention.
Figure 13B:
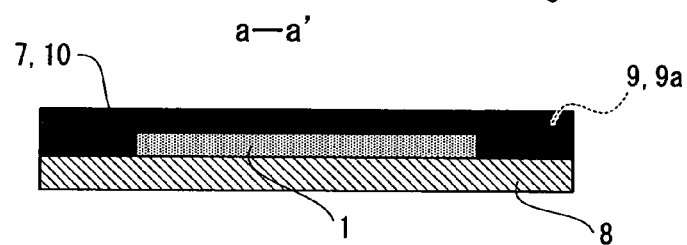
Figure 13C:
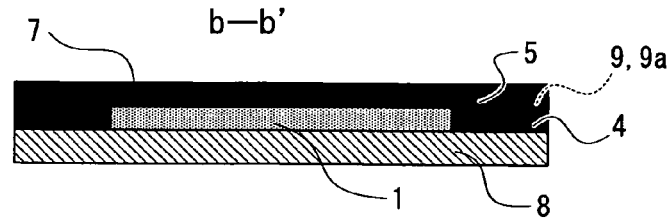
Figure 13D:
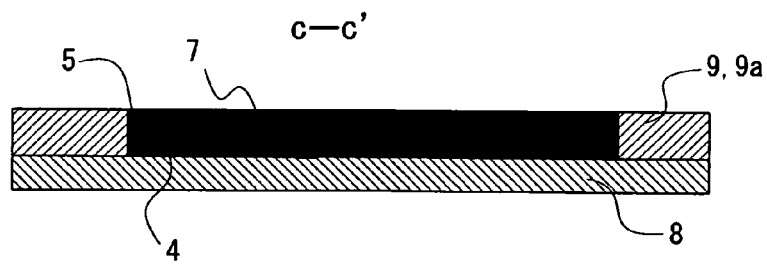
Figure 14:
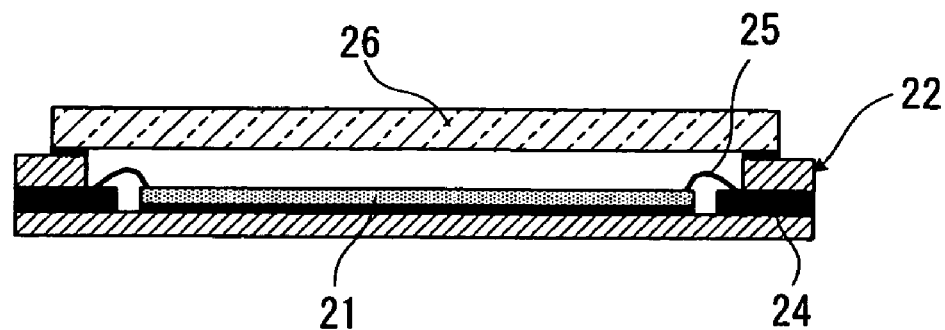
FIG. 14 is a sectional view of a conventional solid-state image pickup device.
Figure 15:
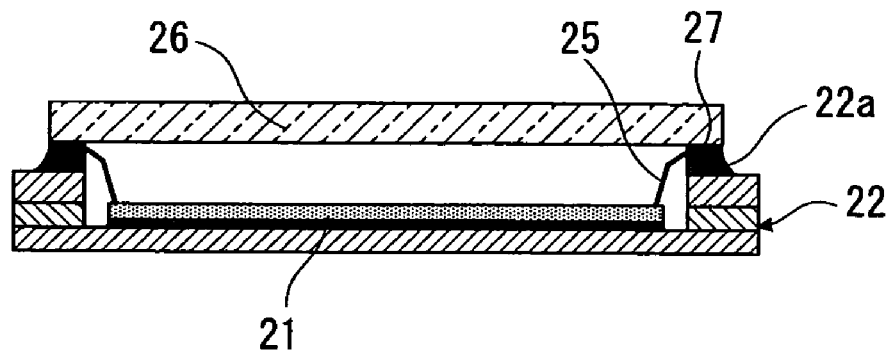
FIG. 15 is a sectional view of another conventional solid-state image pickup device.

FIG. 12A is a plan view of the construction of a solid-state image pickup device in a fourth embodiment of the present invention. FIGS. 12B to 12D are sectional views taken along lines a-a', b-b', and c-c', respectively, in FIG. 12A.

This solid-state image pickup device differs from that in the third embodiment in that a plurality of conductor portions 4 are formed in each of the spaces between wall portions 9a of the package 2 while being spaced apart from each other, and the resin sealing material 7 filling the spaces between the wall portions 9a also functions as an insulating material between the conductor portions 4. This solid-state image pickup device can also be manufactured in the same way as described above with reference to FIGS. 10 and 11.

In semiconductor devices other than optical devices such as solid-state image pickup devices, the interior of the cavity 10 may be filled with the resin sealing material 7 so as to also cover the surface of the solid-state image pickup element 1 without using the cover glass 6, as shown in FIGS. 13A to 13D. Filling of the resin sealing material 7 may be performed by using an application method or by using molding dies.

As described above, the semiconductor device of the present invention has conductor portions provided between the wall portions forming the contour of the package so that the region for connection of thin metal wires from the semiconductor element and the wall region overlap each other, thereby reducing the size of the package in comparison with the conventional art and reducing the size of the device in size in the longitudinal/widthwise and the height of the device in comparison with the conventional device. As a result of the reduction of the size of the package, the length of each electrical conduction path from the semiconductor element to the external terminal is reduced, thereby reducing the inductance of the path and, hence, the signal transmission loss.

Since the connecting portions of the thin metal wires and the conductor portions are covered with the resin, the strength of connection therebetween is high and high connection reliability is ensured. The wall portions serve as a supporting member when the lid plate is attached, while the resin covering the connecting portions does not serve as a supporting member unlike the conventional device. The lid plate can therefore be easily fixed with stability. The transparent lid plate used when an optical device is constructed is attached on the above-described wall portions or on the device element, thereby avoiding misalignment.

The semiconductor device of the present invention is therefore useful when mounted in various electronic appliances such as video cameras, digital cameras, digital still cameras and portable telephones to reduce the size of the product.

What is claimed is:

1. A semiconductor device comprising:
   a base having a base plate and a frame member, the frame member comprising a plurality of wall portions standing upright along a peripheral end of the base plate, the wall portions defining a plurality of spaces between the plurality of wall portions;
   a semiconductor element mounted in an internal space of the base, the semiconductor element having a plurality of electrodes on at least one side thereof;
   a plurality of conductor portions along the peripheral end of the base plate, each located in one of the plurality of spaces between two adjacent wall portions, the conductor portions located on a same side of the base plate as the corresponding electrodes of the semiconductor element along a peripheral end of the semiconductor element;
   thin metal wires electrically connecting each of the electrodes of the semiconductor element to respective conductor portions;
   resin portions in the spaces between the wall portions covering connecting portions of the conductor portions and the thin metal wires; and
   an enclosing member for enclosing the internal space of the base in which the semiconductor element is mounted.

2. The semiconductor device according to claim 1, wherein the wall portions are located at least at corners of the base plate portion.

3. The semiconductor device according to claim 1, wherein the wall portions are arranged to form a shape of a frame along sides of the base plate portion.

4. The semiconductor device according to claim 1, wherein at least one conductor portion is located in each of the spaces between adjacent wall portions.

5. The semiconductor device according to claim 1, wherein the enclosing member comprises a lid plate fixed with a resin on upper surfaces of the wall portions and between the wall portions.

6. The semiconductor device according to claim 5, wherein when the semiconductor element is an optical element, a transparent lid plate is used as the lid plate.

7. The semiconductor device according to claim 5, wherein each wall portion comprises a step portion for positioning the lid plate.

8. The semiconductor device according to claim 1, wherein the enclosing member comprises a resin filled in the internal space of the base to also cover an upper surface portion of the semiconductor element.

9. The semiconductor device according to claim 1, wherein when the semiconductor element is an optical element, the enclosing member comprises a transparent lid plate positioned on the semiconductor element and a resin filled in the internal space of the base around the lid plate.

10. The semiconductor device according to claim 1, wherein outer surfaces of the wall portions and outer surfaces of the resin portions are flush with each other.

11. The semiconductor device according to claim 1, wherein the frame member comprises said conductor portions at opposite ends of the base plate.

12. The semiconductor device according to claim 1, wherein the frame member comprises conductor portions at two opposite ends of the base plate.

13. A method of manufacturing a semiconductor device, comprising:
   forming a base having a base plate and a frame member, the frame member comprising a plurality of wall portions standing upright along a peripheral end of the base plate, the wall portions defining a plurality of spaces between the plurality of wall portions;
   forming a plurality of conductor portions along the peripheral end of the base plate, each conductor portion located in one of the plurality of spaces between two adjacent wall portions;
   mounting a semiconductor element having a plurality of electrodes on at least one side in an internal space of the base;
   electrically connecting each of the electrodes of the semiconductor element to respective conductor portions by means of thin metal wires; filling the spaces between the wall portions with a resin so as to cover the connecting portions between the conductor portions and the thin metal wires; and
   enclosing the internal space of the base with an enclosing member.

14. The method according to claim 13, wherein
   the base plate and the plurality of wall portions are formed integrally with each other, and arrayed so that a plurality of the bases adjacent to each other are formed continuously with each other, and
   wherein the method further comprises dicing the base plate in a direction to bisect the wall portions, thereby forming a plurality of individual bases, each having a respective semiconductor element mounted therein.

15. The method according to claim 13, wherein the enclosing member is a lid plate for covering an upper end opening of the base, and the lid plate is fixed on upper surfaces of the wall portions and resin portions between the wall portions with resin.

16. The method according to claim 15, wherein when the semiconductor element is an optical element, a transparent lid plate is used as the lid plate.

17. The method according to claim 15, wherein the resin for fixing the lid plate is placed on the upper surfaces of the wall portions simultaneously with the resin filling the spaces between the wall portions.

18. The method according to claim 13, further comprising filling the internal space of the base with resin when the internal space of the base is enclosed, thereby covering an upper surface portion of the semiconductor element.

19. The method according to claim 18, wherein filling the internal space of the base with the resin is performed simultaneously when the spaces between the wall portions are filled with the resin.

20. The method according to claim 13, wherein when the semiconductor element is an optical element, enclosing the internal space of the base with an enclosing member comprises:

placing on the upper surface portion of the semiconductor element a transparent lid plate covered with a cover sheet;

filling the internal space of the base up to the upper surface of the transparent lid plate with the resin for filling the spaces between the wall portions; and removing the cover sheet after the resin has set.

21. The method according to claim 20, wherein an injection molding method is employed for filling the resin.

22. The method according to claim 20, wherein an application method is employed for filling the resin, and potting of the resin around the transparent lid plate is performed after removal of the cover sheet.

23. The method according to claim 20, wherein filling the internal space of the base with the resin is performed simultaneously when the spaces between the wall portions are filled with the resin.

* * * * *

UNITED STATES PATENT AND TRADEMARK OFFICE
CERTIFICATE OF CORRECTION

PATENT NO. : 7,595,540 B2  Page 1 of 1
APPLICATION NO. : 11/488062
DATED : September 29, 2009
INVENTOR(S) : Fukuda et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 569 days.

Signed and Sealed this

Twenty-eighth Day of September, 2010

David J. Kappos
*Director of the United States Patent and Trademark Office*